United States Patent
Osada et al.

(10) Patent No.: US 9,027,577 B2
(45) Date of Patent: May 12, 2015

(54) NOZZLE AND A SUBSTRATE PROCESSING APPARATUS INCLUDING THE SAME

(75) Inventors: Naoyuki Osada, Kyoto (JP); Masashi Sawamura, Kyoto (JP); Koji Hasegawa, Kyoto (JP)

(73) Assignee: Screen Holdings Co., Ltd. (JP)

( * ) Notice: Subject to any disclaimer, the term of this patent is extended or adjusted under 35 U.S.C. 154(b) by 1154 days.

(21) Appl. No.: 11/871,595

(22) Filed: Oct. 12, 2007

(65) Prior Publication Data

US 2008/0251107 A1    Oct. 16, 2008

(30) Foreign Application Priority Data

Oct. 13, 2006  (JP) ................................. 2006-280001
Aug. 27, 2007  (JP) ................................. 2007-219835

(51) Int. Cl.
*B08B 3/12*      (2006.01)
*H01L 21/67*    (2006.01)

(52) U.S. Cl.
CPC ...... *H01L 21/67051* (2013.01); *H01L 21/6708* (2013.01)

(58) Field of Classification Search
CPC ..................... H01L 21/6708; H01L 21/67051
USPC ........................... 134/198, 201; 361/212, 215
See application file for complete search history.

(56) References Cited

U.S. PATENT DOCUMENTS

| | | | | |
|---|---|---|---|---|
| 3,592,700 A | * | 7/1971 | Toy | ................................ 148/276 |
| 4,482,476 A | * | 11/1984 | Yoshimura et al. | ............. 252/511 |
| 2002/0014278 A1 | * | 2/2002 | Carmack et al. | .......... 141/311 A |
| 2003/0178047 A1 | * | 9/2003 | Hirae | ............................... 134/26 |
| 2005/0139319 A1 | | 6/2005 | Sugano et al. | |
| 2008/0203182 A1 | | 8/2008 | Sugano et al. | |

FOREIGN PATENT DOCUMENTS

| | | |
|---|---|---|
| CN | 1512832 | 7/2004 |
| CN | 1638059 | 7/2005 |
| JP | 57-174168 | 10/1982 |
| JP | 6-79213 | 3/1994 |
| JP | 11-165115 | 6/1999 |
| JP | 2002-170803 | 6/2002 |
| JP | 2003-86557 | 3/2003 |
| JP | 2003-93984 | 4/2003 |
| JP | 2004-16878 | 1/2004 |
| JP | 2005-58913 | 3/2005 |
| KR | 2003-96003 | 12/2003 |
| KR | 2005-0017588 | 6/2009 |

OTHER PUBLICATIONS

Notice to File Written Opinion issued Oct. 15, 2008 in connection with corresponding Korean Application No. 10-2007-0100880 and English language translation.

* cited by examiner

*Primary Examiner* — David Cormier
(74) *Attorney, Agent, or Firm* — Ostrolenk Faber LLP

(57) ABSTRACT

A nozzle of a nozzle device includes an arm pipe that extends in a horizontal direction and a downstream pipe formed so as to curve downward from one end of the arm pipe. In the nozzle, a metallic pipe is provided inside a second resin pipe. Moreover, a first resin pipe is provided inside the metallic pipe. A boss is attached to the tip of the metallic pipe between the first resin pipe and the second resin pipe. At the tip of the nozzle, an outer peripheral surface of the first resin pipe, an end surface of the second resin pipe and an end surface of the boss are welded by welding resin. In this way, the metallic pipe is reliably coated with the first resin pipe, the second resin pipe, the boss and the welding resin.

12 Claims, 5 Drawing Sheets

NOZZLE AND A SUBSTRATE PROCESSING APPARATUS INCLUDING THE SAME

BACKGROUND OF THE INVENTION

1. Field of the Invention

The present invention relates to a nozzle that discharges a processing liquid and a substrate processing apparatus including the same.

2. Description of the Background Art

Substrate processing apparatuses have been conventionally used to perform a variety of processes on substrates such as semiconductor wafers, glass substrates for photomasks, glass substrates for liquid crystal displays, glass substrates for plasma displays, substrates for optical disks, substrates for magnetic disks, substrates for magneto-optical disks or the like.

In a cleaning process of the substrate, for example, a cleaning liquid and a rinse liquid as a processing liquid is supplied in this order from a processing liquid supply nozzle supported on a tip of a nozzle arm that is arranged in a horizontal direction onto the substrate that is rotated.

As the cleaning liquid, chemical liquids such as buffered hydrofluoric acid (BHF), diluted hydrofluoric acid (DHF), hydrofluoric acid, hydrochloric acid, sulfuric acid, nitric acid, phosphoric acid, acetic acid, oxalic acid, ammonia water and the like are used.

In the substrate processing apparatus in which the chemical liquid is used as the processing liquid, a metal can not be used as a material for the processing liquid supply nozzle, the nozzle arm, a pipe and the like, since use of a metallic member causes metallic corrosion as well as metallic contamination caused by elution of metallic ions. Therefore, the processing liquid supply nozzle, the nozzle arm, the pipe and the like are formed of a resin material such as fluororesin and the like having superior chemical resistance.

In a substrate processing apparatus of JP2002-170803 A, for example, a pipe through which a chemical liquid flows is connected between a downstream portion of a chemical liquid mixer and an upstream portion of a processing liquid supply nozzle and the pipe is formed of a tube made of fluororesin having superior chemical resistance.

Since the resin material such as the fluororesin or the like is an insulating material, however, when the processing liquid flows through the inside of the processing liquid supply nozzle, a friction between the processing liquid and an inner surface of the processing liquid supply nozzle causes static electricity, and consequently the processing liquid becomes charged.

When the processing liquid with a large amount of charges (an absolute value of the electric potential of charges) is supplied onto the substrate to be an processing target, a spark is generated by electric discharge from the processing liquid to the substrate at the moment of the supply of the processing liquid, so that circuits and devices formed on the substrate are damaged in some cases.

Moreover, the nozzle arm requires strength in order to stably support the processing liquid supply nozzle, since the nozzle arm horizontally extends from a position outside the substrate to above the center of the substrate. In a case where the nozzle arm is formed of resin as mentioned above, it is necessary to make the nozzle arm have a larger radial thickness in order to ensure strength.

Thus, the weight of the nozzle arm increases as the outer diameter thereof becomes larger. This causes a load applied to a drive system of the nozzle arm to be larger. In addition, the surface area of the nozzle arm becomes larger, so that the amount of the scattered processing liquid adhering to the nozzle arm also increases.

If the processing liquid adhering to the nozzle arm drops on the substrate, it becomes a cause of processing defects. Furthermore, if the processing liquid adhering to the nozzle arm is dried, it becomes particles, which adhere to the substrate in some cases.

Moreover, when the processing liquid is vibrated by reaction, the nozzle arm and the processing liquid supply nozzle are vibrated accordingly, since the nozzle arm formed of resin has flexibility. In addition, the processing liquid supply nozzle is likely to be vibrated because of the force generated when the discharge of the processing liquid from the processing liquid supply nozzle is started. Thus, the processing liquid is supplied onto irregular positions on the substrate with an irregular force at an irregular rate, so that processing defects of the substrate are liable to occur.

SUMMARY OF THE INVENTION

An object of the present invention is to provide a nozzle that is compact and lightweight and ensures sufficient strength while suppressing electric discharge from an electrically charged processing liquid to a substrate, and a substrate processing apparatus including the same.

(1) According to an aspect of the present invention, a nozzle supported by a supporting member for supplying a processing liquid onto a substrate includes a first resin pipe made of a resin material, through which the processing liquid flows, and having on an end thereof a discharge port that discharges the processing liquid, and a metallic pipe made of a metallic material and provided to cover an outer periphery of the first resin pipe.

In this nozzle, the metallic pipe is provided to cover the outer periphery of the first resin pipe through which the processing liquid flows, and the processing liquid is discharged from the discharge port of the first resin pipe onto the substrate.

The metallic pipe has electrical conductivity and covers the outer periphery of the first resin pipe. Thus, even though the processing liquid is electrically charged, the electrically charged processing liquid is introduced to the part covered with the metallic pipe on the first resin pipe, so that an amount of charges of the processing liquid is reduced. This decreases a potential difference between the processing liquid and the substrate, suppresses electric discharge from the processing liquid to the substrate, and prevents various patterns such as circuits, devices or the like formed on the substrate from being damaged.

Furthermore, since an inner peripheral surface of the metallic pipe and the processing liquid are isolated from each other by the first resin pipe, the metallic pipe does not come into contact with the processing liquid. Accordingly, corrosion of the metallic pipe caused by the processing liquid and elution of metallic ions in the processing liquid are prevented.

Since this metallic pipe has high rigidity, the nozzle is reliably supported by the supporting member without making larger a radial thickness of the metallic pipe. As a result, the nozzle that is compact and lightweight and ensures sufficient strength can be obtained.

In addition, since the metallic pipe has high rigidity, even though the processing liquid that passes through the first resin pipe vibrates due to reaction, the discharge port on the end of the first resin pipe will not vibrate greatly. Moreover, the discharge port will not vibrate because of the force generated at the time of starting the discharge of the processing liquid.

As a result, the processing liquid is well supplied from the discharge port onto the substrate, and processing defects of the substrate are prevented.

(2) The resin material of the first resin pipe may include fluororesin.

In this case, the inner peripheral surface of the metallic pipe and the processing liquid are isolated from each other by the first resin pipe made of fluororesin having superior chemical resistance. This more reliably prevents the metallic pipe and the processing liquid from coming into contact with each other. As a result, corrosion of the metallic pipe caused by the processing liquid and elution of metallic ions in the processing liquid are more reliably prevented.

(3) The nozzle may further include a second resin pipe made of a predetermined resin material and provided to cover an outer peripheral surface of said metallic pipe.

In this case, since the outer peripheral surface of the metallic pipe is isolated from the atmosphere in the periphery of the nozzle by the second resin pipe, droplets of the processing liquid scattered to the periphery of the nozzle and the atmosphere do not come into contact with the metallic pipe. This prevents corrosion of the metallic pipe caused by the droplets of the processing liquid and the atmosphere.

(4) The resin material of the second resin pipe may include electrically conductive resin.

In this case, both the second resin pipe and the metallic pipe have electrical conductivity and cover the outer periphery of the first resin pipe. Thus, even though the processing liquid is electrically charged, the electrically charged processing liquid is introduced to the part covered with the metallic pipe on the first resin pipe, so that the amount of the charges of the processing liquid is sufficiently reduced. This decreases the potential difference between the processing liquid and the substrate, reliably suppresses the electric discharge from the processing liquids to the substrate, and reliably prevents the various patterns such as the circuits, the devices or the like formed on the substrate from being damaged.

(5) The metallic pipe may be grounded. In this case, there is approximately no potential difference between the metallic pipe and the substrate. That is, the electric potential of the charges of the metallic pipe and the substrate becomes approximately zero, respectively. Accordingly, the electrically charged processing liquid is introduced to the part covered with the metallic pipe on the first resin pipe, so that the amount of the charges of the processing liquid is sufficiently reduced. This more reliably suppresses the electric discharge from the processing liquid to the substrate, and reliably and sufficiently prevents the various patterns such as the circuits, the devices or the like formed on the substrate from being damaged by the processing liquid.

(6) The nozzle may further include a resin film that coats a surface of the metallic pipe.

In this case, since the surface of the metallic pipe is coated with the resin film, the processing liquid is reliably prevented from coming into contact with the metallic pipe. Thus, corrosion of the metallic pipe caused by the processing liquid and elution of metallic ions in the processing liquid are reliably prevented.

(7) The resin film may be made of fluororesin. In this case, since the surface of the metallic pipe is coated with the resin film made of fluororesin having superior chemical resistance, the metallic pipe is more reliably prevented from coming into contact with the processing liquid. Accordingly, corrosion of the metallic pipe caused by the processing liquid and elution of metallic ions in the processing liquid are more reliably prevented.

(8) The metallic pipe may be made of stainless steel. Stainless steel has superior corrosion resistance and high strength. This sufficiently prevents corrosion of the metallic pipe and enables the thickness of the metallic pipe to be sufficiently thin while keeping strength.

(9) The end of the first resin pipe may project from the end of the metallic pipe.

In this case, the whole inner peripheral surface of the metallic pipe can be more reliably coated with the first resin pipe.

In addition, the discharge port provided at the end of the first resin pipe projects from the end of the metallic pipe. Thus, the processing liquid discharged from the discharge port is well supplied onto the substrate without coming into contact with the end of the metallic pipe.

(10) The nozzle may further include a sealing member made of resin and sealing the end of the metallic pipe. In this case, since the end of the metallic pipe is sealed by the sealing member, the processing liquid does not come into contact with the end of the metallic pipe. Accordingly, corrosion of the end of the metallic pipe caused by the processing liquid and elution of metallic ions in the processing liquid are prevented.

(11) According to another aspect of the present invention, a substrate processing apparatus that performs a predetermined process on a substrate includes a substrate holder that holds the substrate and a nozzle for supplying a processing liquid onto the substrate held by the substrate holder, wherein the nozzle is supported by a supporting member, and includes a first resin pipe made of a resin material, through which the processing liquid flows, and having on an end thereof a discharge port that discharges the processing liquid, and a metallic pipe made of a metallic material and provided to cover an outer periphery of the first resin pipe.

In this substrate processing apparatus, the substrate is held by the substrate holder and the processing liquid is supplied from the nozzle onto the substrate held by the substrate holder.

In this nozzle, the metallic pipe is provided to cover the outer periphery of the first resin pipe through which the processing liquid flows, and the processing liquid is discharged from the discharge port of the first resin pipe onto the substrate.

The metallic pipe has electrical conductivity and covers the outer periphery of the first resin pipe. Thus, even though the processing liquid is electrically charged, the electrically charged processing liquid is introduced to the part covered with the metallic pipe on the first resin pipe, so that an amount of charges of the processing liquid is reduced. This decreases a potential difference between the processing liquid and the substrate, suppresses electric discharge from the processing liquid to the substrate, and prevents various patterns such as circuits, devices or the like formed on the substrate from being damaged.

Furthermore, since an inner peripheral surface of the metallic pipe and the processing liquid are isolated from each other by the first resin pipe, the metallic pipe does not come into contact with the processing liquid. Accordingly, corrosion of the metallic pipe caused by the processing liquid and elution of metallic ions in the processing liquid are prevented.

Since this metallic pipe has high rigidity, the nozzle is reliably supported by the supporting member without making larger a radial thickness of the metallic pipe. As a result, the nozzle that is compact and lightweight and ensures sufficient strength can be obtained.

In addition, since the metallic pipe has high rigidity, even though the processing liquid that passes through the inside of the first resin pipe vibrates due to reaction, the discharge port on the end of the first resin pipe will not vibrate greatly. Moreover, the discharge port will not vibrate because of the force generated at the time of starting the discharge of the processing liquid. As a result, the processing liquid is well supplied from the discharge port onto the substrate, and processing defects of the substrate are prevented.

Accordingly, the substrate processing apparatus that well supplies the processing liquid while suppressing the electric discharge from the electrically charged processing liquid to the substrate and reliably prevents processing defects of the substrate can be provided.

Other features, elements, characteristics, and advantages of the present invention will become more apparent from the following description of preferred embodiments of the present invention with reference to the attached drawings.

DESCRIPTION OF THE PREFERRED EMBODIMENTS

A nozzle and a substrate processing apparatus including the same according to one embodiment of the present invention will now be described with reference to drawings.

In the following description, a substrate refers to a semiconductor wafer, a glass substrate for a liquid crystal display, a glass substrate for a PDP (plasma display panel), a glass substrate for a photomask, a substrate for an optical disk, or the like.

In addition, a processing liquid includes a chemical liquid and a rinse liquid. Examples of the chemical liquid include buffered hydrofluoric acid (BHF), diluted hydrofluoric acid (DHF), hydrofluoric acid (hydrogen fluoride water: HF), hydrochloric acid, sulfuric acid, nitric acid, phosphoric acid, acetic acid, oxalic acid, an aqueous solution of ammonia water and the like or a mixture solution thereof. Note that examples of the mixture solution include a mixture solution of highly heated sulfuric acid ($H_2SO_4$) and oxygenated water ($H_2O_2$) (hereinafter abbreviated as SPM) or a mixture solution of hydrochloric acid (HCl) and oxygenated water (hereinafter abbreviated as SC2).

Examples of the rinse liquid include pure water, carbonated water, ozone water, magnetic water, regenerated water (hydrogen water) and ion water, as well as organic solvent such as IPA (isopropyl alcohol).

(1) STRUCTURES OF SUBSTRATE PROCESSING APPARATUS

Figure 1:
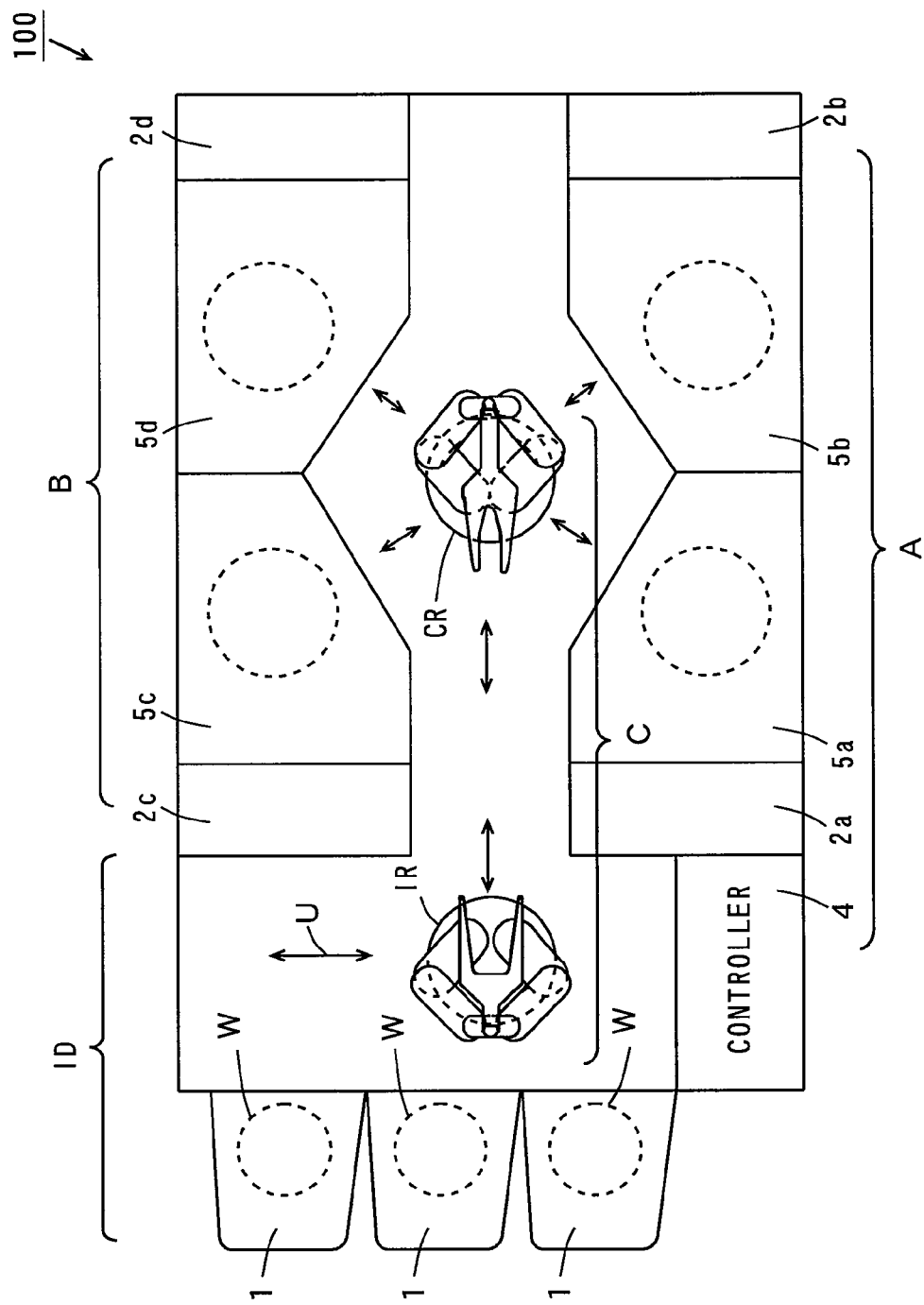
FIG. 1 is a plan view of a substrate processing apparatus according to one embodiment of the present invention.

FIG. 1 is a plan view of a substrate processing apparatus according to one embodiment of the present invention. As shown in FIG. 1, the substrate processing apparatus 100 includes processing regions A, B, and a transporting region C therebetween.

A controller 4, fluid boxes 2a, 2b and cleaning processing units 5a, 5b are arranged in the processing region A.

The fluid boxes 2a, 2b in FIG. 1 respectively house fluid-related equipment such as pipes, joints, valves, flow meters, regulators, pumps, temperature controllers, processing liquid storage tanks or the like involved in supply and drain (discharge) the chemical liquid and the rinse liquid to/from the cleaning processing units 5a, 5b.

A nozzle device according to the one embodiment of the present invention is provided in the cleaning processing unit 5a, 5b. In the cleaning processing unit 5a, 5b, a cleaning process of the substrate W by the chemical liquid (hereinafter referred to as a chemical liquid process) and a cleaning process of the substrate W by the rinse liquid (hereinafter referred to as a rinsing process) are performed. In the present embodiment, the chemical liquid used in the cleaning processing units 5a, 5b is SPM, SC2 or hydrofluoric acid and the rinse liquid used in the cleaning processing units 5a, 5b is pure water, for example. Details of the nozzle device will be described later.

In the processing region B, fluid boxes 2c, 2d and cleaning processing units 5c, 5d are arranged. The fluid boxes 2c, 2d and the cleaning processing units 5c, 5d respectively have similar structures to those of the above mentioned fluid boxes 2a, 2b and the cleaning processing units 5a, 5b. The cleaning processing units 5c, 5d respectively perform similar process to that of the cleaning processing units 5a, 5b.

Hereinafter, the cleaning processing units 5a to 5d will be collectively referred to as processing units. In the transporting region C, a substrate transporting robot CR is provided.

An indexer ID for carrying in and out the substrate W is arranged on one end of the processing regions A, B, and an indexer robot IR is provided inside the indexer ID. Carriers 1 that respectively house the substrates W are mounted on the indexer ID.

The indexer robot IR in the indexer ID moves in a direction of an arrow U to take out the substrate W from the carrier 1 and transfer the substrate W to the substrate transporting robot CR. Conversely, the indexer robot IR receives the substrate W subjected to a series of processes from the substrate transporting robot CR and returns it to the carrier 1.

The substrate transporting robot CR transports the substrate W transferred from the indexer robot IR to a specified processing unit, or transports the substrate W received from the processing unit to another processing unit or to the indexer robot IR.

In the present embodiment, after the chemical liquid process and the rinsing process are performed on the substrate W in any of the cleaning processing units 5a to 5d, the substrate W is carried out from the cleaning processing unit 5a to 5d by the substrate transporting robot CR, and carried into the carrier 1 by the indexer robot IR.

The controller 4 is composed of a computer or the like including a CPU (central processing unit), and controls the operation of each of the processing units in the processing regions A, B, the operation of the substrate transporting robot CR in the transporting region C and the operation of the indexer robot IR in the indexer ID.

(2) STRUCTURES OF THE CLEANING PROCESSING UNIT AND THE NOZZLE DEVICE

Figure 2:
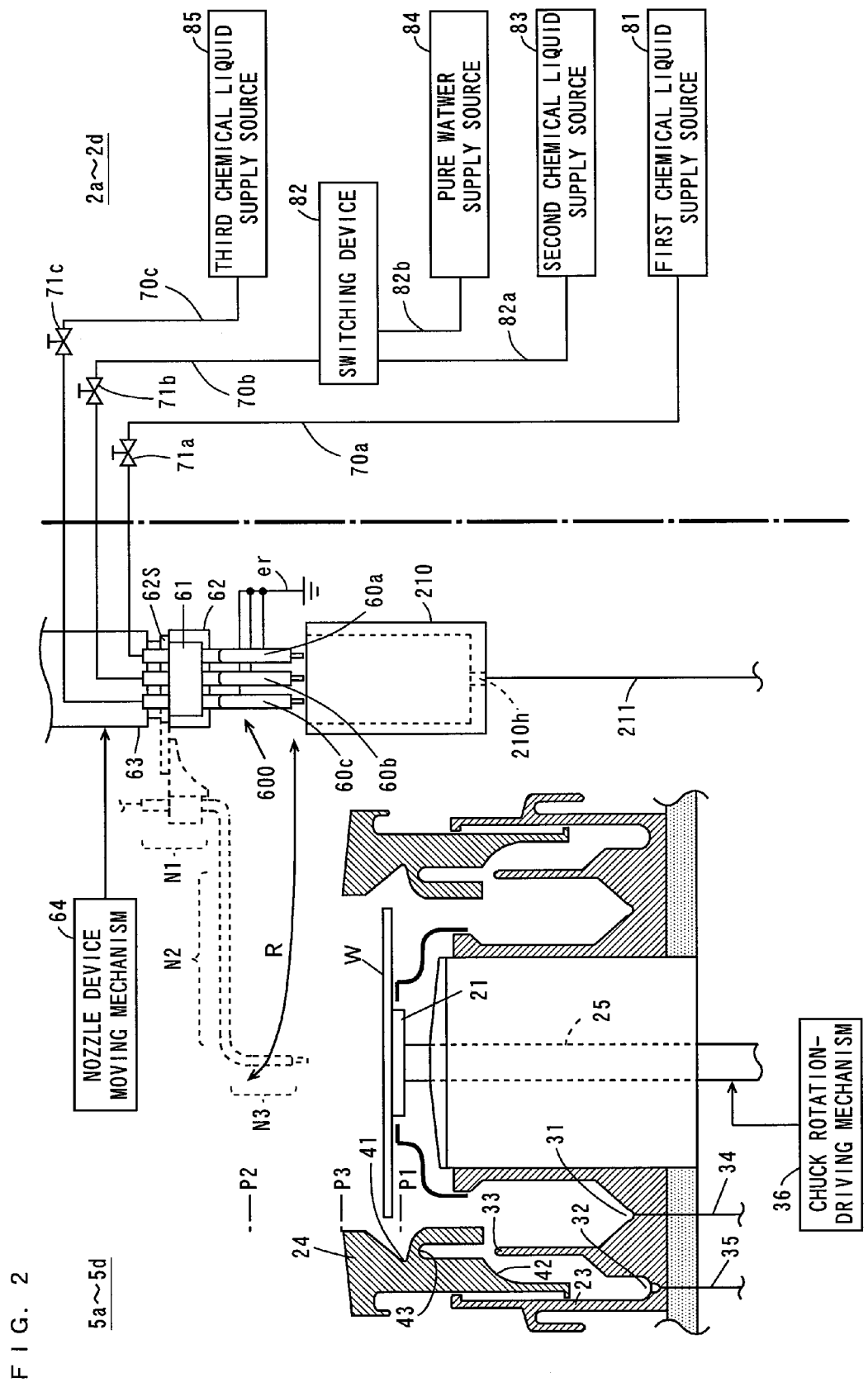
FIG. 2 is a diagram for use in explaining structures of a cleaning processing unit and a fluid box of the substrate processing apparatus according to the one embodiment of the present invention.
Figure 3:
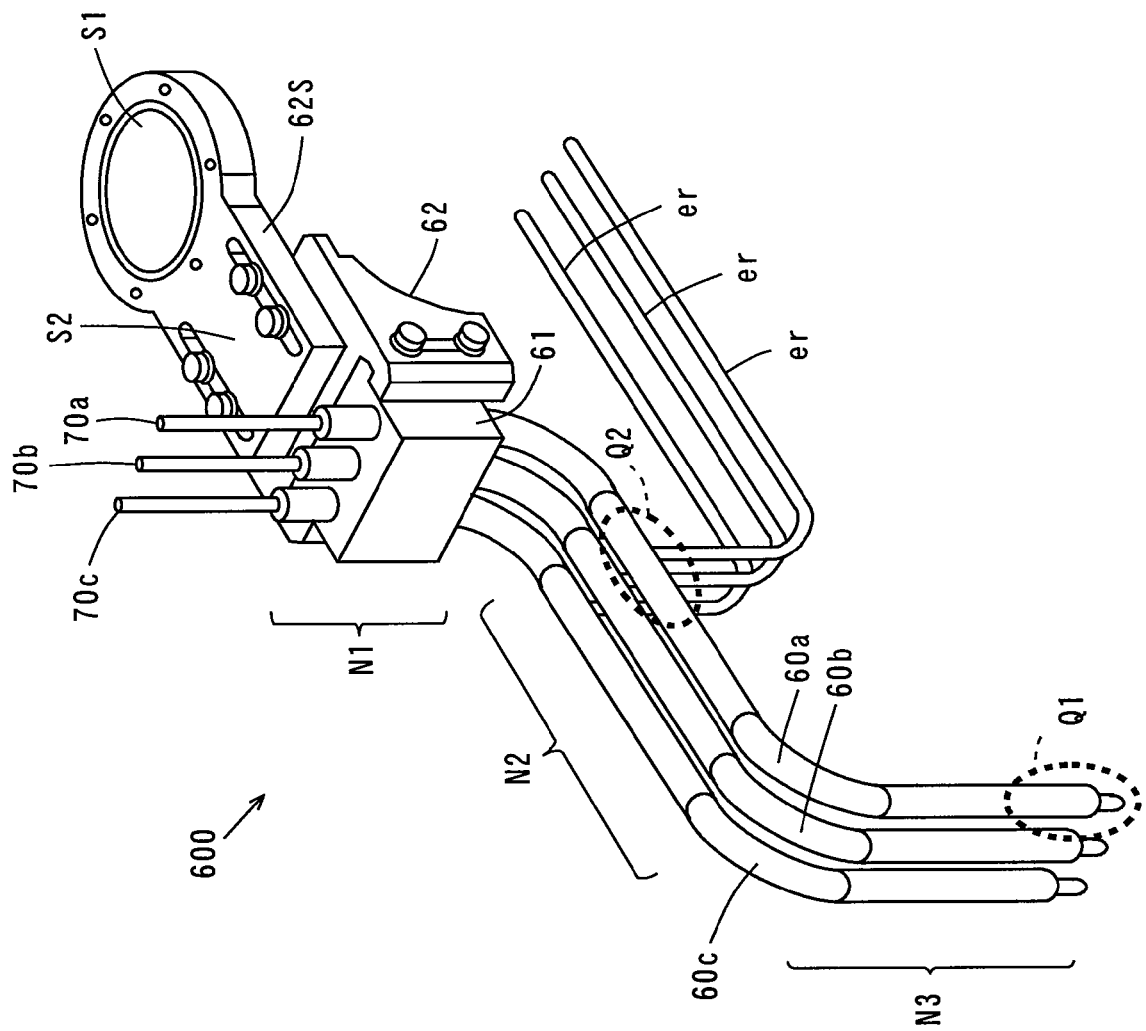
FIG. 3 is an external perspective view of a nozzle device provided in the cleaning processing unit of FIG. 2.

FIG. 2 is a diagram for use in explaining the structures of the cleaning processing unit 5a to 5d and the fluid box 2a to 2d in the substrate processing apparatus 100 according to the one embodiment of the present invention. FIG. 3 is an external perspective view of the nozzle device provided in the cleaning processing unit 5a to 5d of FIG. 2.

The cleaning processing unit 5a to 5d of FIG. 2 performs the rinsing process after impurities such as organic substances or the like adhering to the surface of the substrate W are removed by the chemical liquid process.

As shown in FIG. 2, the cleaning processing unit 5a to 5d is provided with a spin chuck 21 for holding the substrate W horizontally while rotating the substrate W around a vertical rotation shaft passing through the center of the substrate W. The spin chuck 21 is secured on an upper end of a rotation shaft 25, which is rotated by a chuck rotation-driving mechanism 36.

The substrate W is rotated while being horizontally held by the spin chuck 21 during the chemical liquid process and the rinsing process. Note that a mechanical spin chuck that holds the substrate W by seizing only a plurality of parts in a periphery of the substrate W may be used, though the suction spin chuck 21 that is composed of a suction spin chuck is used in the present embodiment, as shown in FIG. 2.

A rotation shaft 63 extending from above is provided outside the spin chuck 21 so as to be rotated while being moved up and down by a nozzle device moving mechanism 64. The nozzle device 600 is provided on a lower end of the rotation shaft 63 so as to be positioned above the substrate W held by the spin chuck 21.

The spin chuck 21 is housed in a processing cup 23. A cylindrical partition wall 33 is provided inside the processing cup 23. A drain space 31 for recovering and discarding the rinse liquid used for the rinsing process of the substrate W is formed so as to surround the spin chuck 21. The drain space 31 is formed into a circular and groove form so as to follow an outer circumference of the spin chuck 21.

Furthermore, a liquid circulation space 32 for recovering the chemical liquid used in the chemical liquid process of the substrate W and allowing it to circulate in the substrate processing apparatus 100 is provided between the processing cup 23 and the partition wall 33 so as to surround the drain space 31. The liquid circulation space 32 is formed into a circular and groove form so as to follow the outer circumference of the drain space 31.

The drain space 31 is connected to a drain pipe 34 for leading the rinse liquid to a drain system in a factory that is now shown, and the liquid circulation space 32 is connected to a recovery pipe 35 for leading the chemical liquid to a chemical liquid recovery device that is not shown.

Above the processing cup 23, a splash guard 24 is provided for preventing the chemical liquid or the rinse liquid from being scattered outwardly from the substrate W. This splash guard 24 has a rotation symmetric shape with respect to the rotation shaft 25. In an inner surface of an upper end of the splash guard 24, a drain guiding groove 41 having a V-shaped cross section is annularly formed.

In the inner surface of a lower end of the splash guard 24, a recovery liquid guide 42 having an inclined face that inclines down outwardly is formed. In the vicinity of an upper end of the recovery liquid guide 42, a partition wall-housing groove 43 for receiving the partition wall 33 of the processing cup 23 is formed.

The splash guard 24 is supported by a guard lifting mechanism composed of a ball screw mechanism or the like (not shown). The guard lifting mechanism moves the splash guard 24 upward and downward from/to a carrying in and out position P1 in which the upper end of the splash guard 24 is in approximately the same or lower position as/than that of an upper end of the spin chuck 21, a circulation position P2 in which the recovery liquid guide 42 faces an outer circumference of the substrate W held by the spin chuck 21 and a drain position P3 in which the drain guiding groove 41 faces the outer circumference of the substrate W held by the spin chuck 21.

When the substrate W is carried to and from the spin chuck 21, the splash guard 24 is lowered to the carrying in and out position P1.

When the splash guard 24 is in the circulation position P2, the chemical liquid scattered outwardly from the substrate W is led to the liquid circulation space 32 by the recovery liquid guide 42, and sent to the chemical liquid recovery device that is not shown through the recovery pipe 35. Note that the chemical liquid recovered by the chemical liquid recovery device circulates in the substrate processing apparatus 100, and is used again in the chemical liquid process.

On the other hand, when the splash guard 24 is in the drain position P3, the rinse liquid scattered outwardly from the substrate W is led to the drain space 31 by the drain guiding groove 41, and sent to the drain system in the factory that is not shown through the drain pipe 34.

As shown in FIG. 3, the nozzle device 600 includes three nozzles 60a, 60b, 60c, a block-shaped coupling member 61, a holder 62 and a rotating platform 62S.

The nozzles 60a to 60c have the same shape. Each of the nozzles 60a to 60c is integrally composed of an upstream pipe N1, an arm pipe N2 and a downstream pipe N3.

The arm pipes N2 extend in a horizontal direction, the upstream pipes N1 extend in a vertical direction so as to curve upward from one end of the arm pipes N2, and the downstream pipes N3 extend in the vertical direction so as to curve downward from the other end of the arm pipes N2.

Three through holes (not shown) are formed in the block-shaped coupling member 61, and the upstream pipes N1 of the nozzles 60a to 60c are inserted into these through holes.

Accordingly, the three nozzles 60a to 60c are integrally secured by the block-shaped coupling member 61.

The rotating platform 62S is composed of a circular portion S1 and a rectangular portion S2. The circular portion S1 of the rotating platform 62S is connected to the lower end of the above described rotation shaft 63 (FIG. 2). On the other hand, the rectangular portion S2 of the rotating platform 62S is attached to the holder 62.

The holder 62 is attached to the block-shaped coupling member 61. Thus, the three nozzles 60a to 60c are rotatably supported by the rotation shaft 63 via the block-shaped coupling member 61, the holder 62 and the rotating platform 62S.

As indicated by the arrow R of FIG. 2, the rotation shaft 63 is rotated, so that the downstream pipes N3 of the nozzles 60a to 60c move between an upper position above the center of the substrate W held by the spin chuck 21 (hereinafter referred to as a substrate upper position) and a position above a nozzle waiting pot 210 provided in a region outside the substrate W (hereinafter referred to as a nozzle waiting upper position). The nozzle waiting pot 210 has a box shape, with an upper portion thereof being open.

In the nozzle device 600 of FIG. 3, the block-shaped coupling member 61, the holder 62 and the rotating platform 62S are formed of resin such as, for example, heat-treated polyvinyl chloride (HTPVC), polypropylene (PP), fiberglass-reinforced polypropylene (FRPP) or the like.

Fluid supply pipes 70a, 70b, 70c extend from upper ends of the upstream pipes N1 of the nozzles 60a, 60b, 60c, respectively. Ground connection wires er extend from the arm pipes N2 of the nozzles 60a to 60c, respectively.

As shown in FIG. 2, the fluid supply pipes 70a, 70b, 70c are connected, respectively, to a first chemical liquid supply source 81, a switching device 82 and a third chemical liquid supply source 85 provided in the fluid box 2a to 2d. The switching device 82 in the fluid box 2a to 2d is further connected to a second chemical liquid supply source 83 by a fluid supply pipe 82a, while being connected to a pure water supply source 84 by a fluid supply pipe 82b. Moreover, discharge valves 71a, 71b, 71c are provided, respectively, in the middle of the fluid supply pipes 70a, 70b, 70c capable of being opened and closed for permitting and inhibiting the flow of the chemical liquid or the pure water therethrough.

Accordingly, a first chemical liquid is supplied from the first chemical liquid supply source 81 to the nozzle 60a through the fluid supply pipe 70 when the discharge valve 71a is opened.

The switching device 82 includes a valve or the like, for example, and selectively supplies either a second chemical liquid supplied from the second chemical liquid supply source 83 or the pure water supplied from the pure water supply source 84 to the nozzle 60b. In this way, the second chemical liquid or the pure water is supplied to the nozzle 60b through the fluid supply pipe 70b when the discharge valve 71b is opened.

A third chemical liquid is supplied from the third chemical liquid supply source 85 to the nozzle 60c through the fluid supply pipe 70c when the discharge valve 71c is opened.

Note that the first chemical liquid supply source 81, the second chemical liquid supply source 83, the third chemical liquid supply source 85 and the pure water supply source 84 may not necessarily be arranged in the fluid box 2a to 2d.

The first chemical liquid supply source 81, the second chemical liquid supply source 83, the third chemical liquid supply source 85 and the pure water supply source 84 may be, for example, a chemical liquid supply system or a pure water supply system in the factory not shown.

The ground connection wires er extending from the nozzles 60a, 60b, 60c are connected to a ground line of the substrate processing apparatus 100.

In the present embodiment, SPM, SC2, and HF are used as the first chemical liquid, the second chemical liquid and the third chemical liquid, respectively.

Thus, in removal of resist residues on the substrate W, SPM as the first chemical liquid or SC2 as the second chemical liquid is supplied onto the substrate W. In removal of an oxide film on the substrate W, HF as the third chemical liquid is supplied onto the substrate W. After the chemical liquid process by any of the first to third chemical liquids is performed on the substrate W, the pure water is supplied onto the substrate W to perform the rinsing process.

(3) OPERATIONS OF THE NOZZLE DEVICE

Operations of the nozzle device 600 during the chemical liquid process and the rinsing process will be described. Before the chemical liquid process is started, lower ends of the downstream pipes N3 of the nozzles 60a to 60c are housed in the nozzle waiting pot 210.

When the chemical liquid process is started, the rotation shaft 63 is moved up by the nozzle device moving mechanism 64. Thus, the nozzles 60a to 60c are moved up, so that the downstream pipes N3 of the nozzles 60a to 60c move from the nozzle waiting pot 210 to the nozzle waiting upper position.

Then, the rotation shaft 63 is rotated by the nozzle device moving mechanism 64 described above, so that the downstream pipes N3 of the nozzles 60a to 60c move from the nozzle waiting upper position to the substrate upper position.

The rotation shaft 63 is subsequently lowered by the nozzle device moving mechanism 64. Accordingly, the nozzles 60a to 60c are lowered, so that the lower ends of the downstream pipes N3 of the nozzles 60a to 60c are brought close to the surface of the substrate W.

In this state, any of the first to third chemical liquids is supplied from the nozzles 60a to 60c onto the substrate W, and the chemical liquid process is performed.

When the chemical liquid process is finished, the supply of the chemical liquid onto the substrate W is stopped. Then, the pure water is supplied from the nozzle 60b onto the substrate W. In this way, the rinsing process is performed.

After the rinsing process is finished, the supply of the pure water onto the substrate W is stopped. Then, the nozzles 60a to 60c are moved up by the nozzle device moving mechanism 64, so that the downstream pipes N3 of the nozzles 60a to 60c move from the position close to the surface of the substrate W to the substrate upper position.

Next, the rotation shaft 63 is rotated again by the nozzle device moving mechanism 64, so that the downstream pipes N3 of the nozzles 60a to 60c move from the substrate upper position to the nozzle waiting upper position. The nozzles 60a to 60c are subsequently lowered by the nozzle device moving mechanism 64, so that the lower ends of the downstream pipes N3 are housed in the nozzle waiting pot 210.

In this state, the nozzle waiting pot 210 recovers the processing liquid (the first to third chemical liquids or the pure water) falling in drops from the nozzles 60a to 60c after the chemical liquid process and the rinsing process.

An opening 210h is formed in a lower end of the nozzle waiting pot 210. A pipe 211 that leads the processing liquid recovered by the nozzle waiting pot 210 to the chemical liquid recovery device or the drain system in the factory, which are not shown, is connected to the opening 210h. Thus, the processing liquid recovered by the nozzle waiting pot 210 is recovered or drained through the pipe 211.

(4) DETAILS OF THE STRUCTURES OF THE NOZZLE

Figure 4:
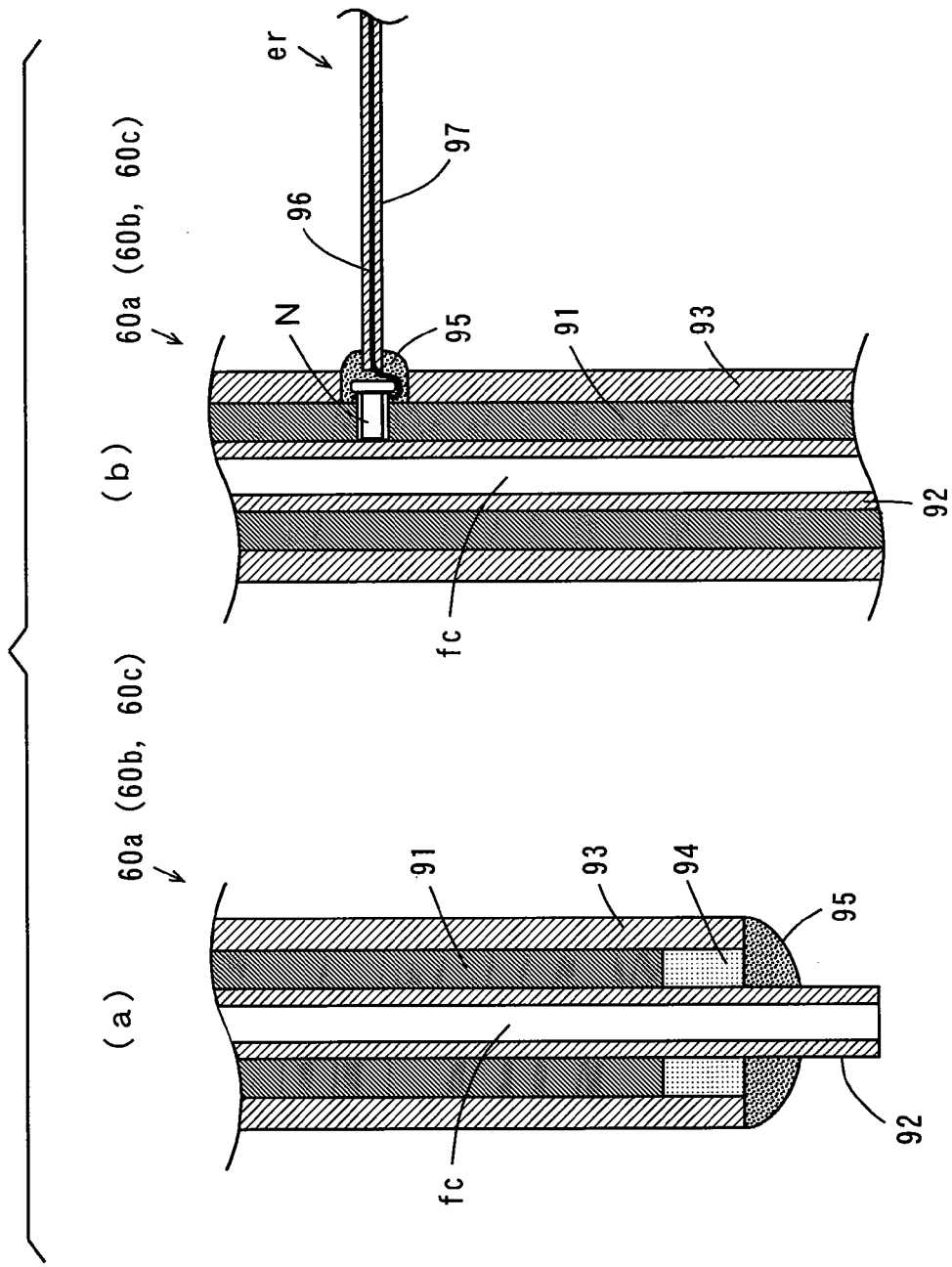
FIG. 4 is partially enlarged sectional views of a nozzle in the nozzle device of FIG. 3.

The structures of the nozzles 60a to 60c of FIG. 2 and FIG. 3 will be described in detail. FIG. 4 is a partially enlarged sectional view of the nozzle 60a in the nozzle device 600 of FIG. 3.

The enlarged sectional view of a portion Q1 (a tip portion) of the nozzle 60a indicated by a bold dotted line in FIG. 3 is shown in FIG. 4(a). The enlarged sectional view of a portion Q2 (a connecting part of the ground connection wire er) of the nozzle 60a indicated by a bold dotted line in FIG. 3 is shown in FIG. 4(b).

As shown in FIG. 4(a), the nozzle 60a includes a metallic pipe 91, a first resin pipe 92, a second resin pipe 93 and a cylindrical boss 94.

The first resin pipe 92 includes an internal flow path fc through which the processing liquid flows, having a structure where the processing liquid is discharged from an opening of a tip portion (a lower end) thereof and having an outer diameter slightly smaller than the inner diameter of the metallic pipe 91. The first resin pipe 92 is inserted into the metallic pipe 91. The tip portion of the first resin pipe 92 projects from the tip of the metallic pipe 91 by a predetermined length.

The second resin pipe 93 has a slightly larger inner diameter than the outer diameter of the metallic pipe 91. The metallic pipe 91 is inserted into the second resin pipe 93. In this state, the tip portion of the first resin pipe 92 projects from the tip of the second resin pipe 93 by a predetermined length.

The boss 94 has approximately the same inner diameter as the outer diameter of the first resin pipe 92 and has approximately the same outer diameter as that of the metallic pipe 91. Thus, the boss 94 is mounted on the tip portion of the metallic pipe 91 inside the second resin pipe 93.

In the tip portion of the nozzle 60a, the outer peripheral surface of the first resin pipe 92, the end surface of the second resin pipe 93 and the end surface of the boss 94 are welded by welding resin 95.

In the above structure, the metallic pipe 91 is reliably coated with the first resin pipe 92, the second resin pipe 93, the boss 94 and the welding resin 95.

As shown in FIG. 3, the fluid supply pipe 70a extends from the upper end of the upstream pipe N1 of the nozzle 60a. This fluid supply pipe 70a is formed by extending the first resin pipe 92 of FIG. 4(a) and FIG. 4(b).

In the arm pipe N2 of the nozzle 60a, a through hole is formed in one part of the second resin pipe 93, and a screw hole is provided in one part of the metallic pipe 91 as shown in FIG. 4(b).

A screw N connected to a ground wire 96 is attached to the screw hole of the metallic pipe 91. Thus, the ground wire 96 and the metallic pipe 91 are connected to each other.

The ground wire 96, excluding part thereof connected to the metallic pipe 91, is coated with a resin tube 97. The ground connection wire er of FIG. 2 and FIG. 3 is composed of the ground wire 96 and the resin tube 97 that coats the ground wire 96.

One end of the resin tube 97 is welded to an outer peripheral surface of the second resin pipe 93 by the welding resin 95. Thus, the connection part of the metallic pipe 91 and the ground wire 96 are reliably coated with resin.

The ground connection wire er connected to the nozzle 60a is connected to the ground line of the substrate processing apparatus 100 as shown in FIG. 2. Accordingly, the metallic pipe 91 is reliably grounded.

In the present embodiment, a conductive metallic material having high strength is used for the above metallic pipe 91. As the metallic material, a metallic material such as stainless steel having high corrosion resistance is more preferably used, while stainless steel, iron, copper, bronze, brass, aluminum, silver, gold or the like can be used, for example.

While materials such as fluororesin, vinyl chloride resin or the like that have superior chemical resistance are used for the first resin pipe 92, the second resin pipe 93, the boss 94, the welding resin 95 and the resin tube 97, fluororesin is preferably used.

Fluororesin includes polytetrafluoroethylene (PTFE) and polytetrafluoroethylene-perfluoroalkoxyethylene copolymer (PFA), for example.

Here, PFA having flexibility is more preferably used for the first resin pipe 92, the second resin pipe 93, the welding resin 95 and the resin tube 97, and polytetrafluoroethylene that is harder than PFA is more preferably used for the boss 94. This facilitates the manufacture of the nozzle 60a.

While FIG. 4 shows the internal structure of the nozzle 60a, the other nozzles 60b, 60c also have the same internal structure.

(5) EFFECTS OF THE EMBODIMENT

The nozzles 60a to 60c are made of the metallic pipes 91 having high strength. Thus, the strength needed for supporting the downstream pipes N3 can be obtained without making larger the radial thickness of the arm pipes N2 of the nozzles 60a to 60c as shown in FIG. 2 and FIG. 3.

Moreover, since the radial thickness of the arm pipes N2 of the nozzles 60a to 60c is not required to be larger, the nozzles 60a to 60c can be reduced in weight and a load applied to the nozzle device moving mechanism 64 can be decreased.

Furthermore, since it is not necessary to make larger the radial thickness of the arm pipes N2 of the nozzles 60a to 60c, the outer diameter of each of the nozzles 60a to 60c can be reduced. Thus, the size and the surface area of each of the nozzles 60a to 60c are decreased, so that the amount of the processing liquid adhering to the arm pipes N2 is sufficiently reduced.

This prevents processing defects of the substrate W caused when the processing liquid adhering to the arm pipes N2 is dropped onto the substrate W, and also prevents the substrate W from being contaminated with particles that are generated when the processing liquid adhering to the arm pipes N2 is dried.

In addition, the metallic pipes 91 constituting the nozzles 60a to 60c have rigidity. Therefore, even though the processing liquid in the nozzles 60a to 60c vibrates due to reaction, the nozzles 60a to 60c will not vibrate greatly. Moreover, the nozzles 60a to 60c will not vibrate because of the force generated at the time of starting the discharge of the processing liquid. Accordingly, the processing defects of the substrate caused by the vibration of the nozzles 60a to 60c are prevented.

Furthermore, the metallic pipes 91 constituting the nozzles 60a to 60c are coated with the first resin pipes 92, the second resin pipes 93, the bosses 94 and the welding resin 95 that have superior chemical resistance, while the ground wires 96 connected to the metallic pipes 91 are also coated with the welding resin 95 and the resin tubes 97 that have superior chemical resistance. In addition, the fluid supply pipes 70a to 70c made of resin (FIG. 2) are provided in the nozzles 60a to 60c, respectively, to continuously extend from the first resin pipes 92 to introduce the processing liquid to the nozzles 60a to 60c.

Thus, the metallic pipes 91 and the ground wires 96 are not brought into contact with the chemical liquid and the chemical liquid atmosphere even in the case where the chemical liquid process is performed in the cleaning processing units 5a to 5d. Consequently, corrosion of the metallic pipes 91 and the ground wires 96 caused by the chemical liquid as well as metallic contamination caused by elution of metallic ions are prevented.

As described above, the electrically charged processing liquid is supplied to the nozzles 60a to 60c through the fluid supply pipes 70a to 70c (FIG. 2) in the chemical liquid process of the substrate W.

Here, the metallic pipes 91 have electrical conductivity, and cover the outer periphery of the first resin pipes 92. Thus, the electrically charged processing liquid is introduced to the nozzles 60a to 60c having parts covered with the metallic pipes 91, so that the amount of the charges of the processing liquid is reduced. Accordingly, the electric discharge from the processing liquid to the substrate W is suppressed during the supply of the processing liquid from the nozzles 60a to 60c onto the substrate W. This reliably prevents various patterns such as circuits, devices or the like formed on the substrate W from being damaged.

Note that the applicant's experiment has revealed that the effect that the electric discharge from the processing liquid to the substrate W is suppressed by reducing the amount of the charges of the processing liquid cannot be achieved only by, for example, bringing the metallic wires into direct contact with very small parts of the first resin pipes 92, and it is necessary to cover the outer periphery of the first resin pipes 92 with a predetermined metallic material or conductive material.

(6) OTHER STRUCTURAL EXAMPLES OF THE NOZZLES

Figure 5:
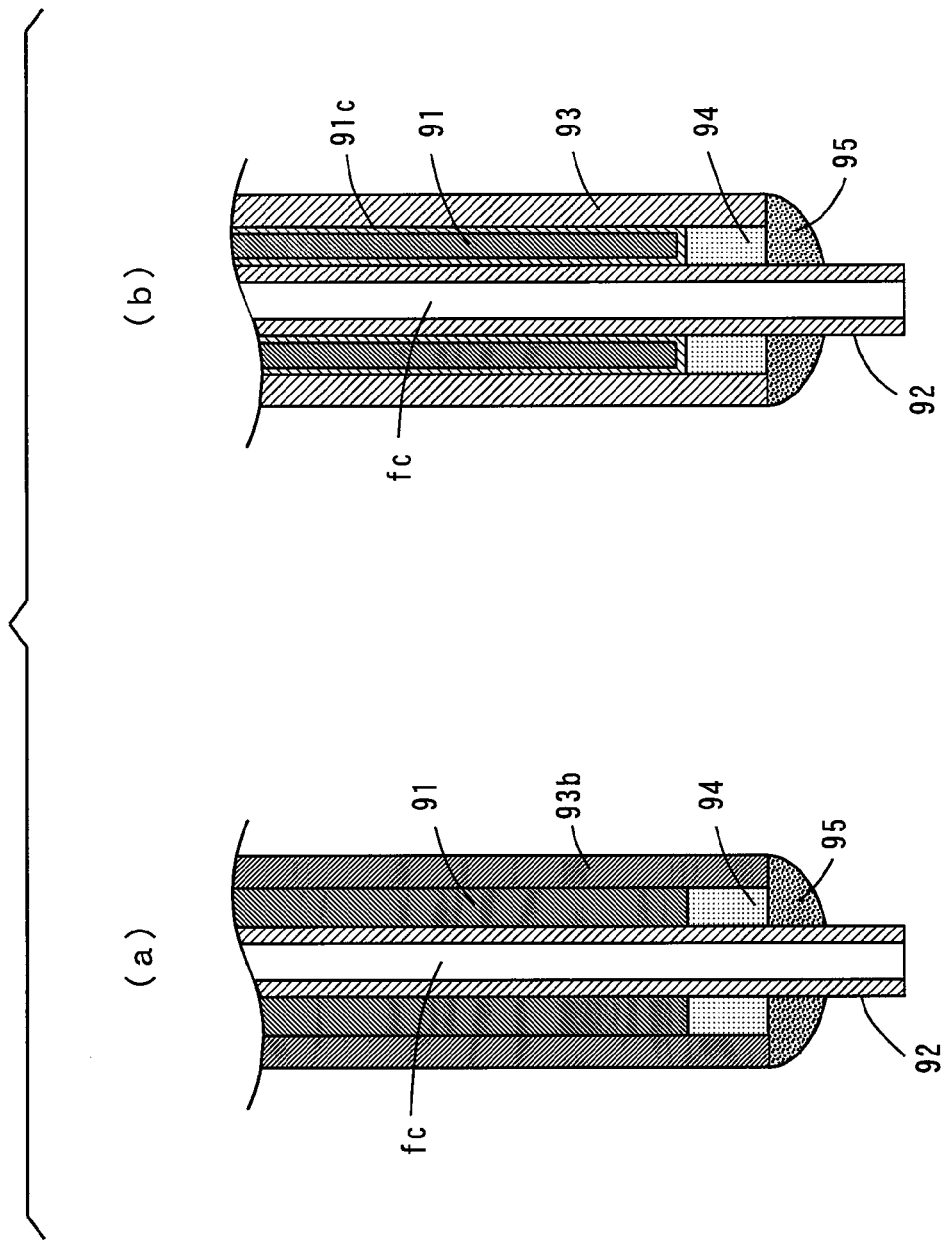
FIG. 5 is diagrams showing other structural examples of the nozzle provided in the nozzle device of FIG. 2 and FIG. 3.

In the present embodiment, the nozzle 60a to 60c may include the following structures. FIG. 5(a) and FIG. 5(b) are diagrams showing the other structural examples of the nozzle provided in the nozzle device 600 of FIG. 2 and FIG. 3. For the respective structural examples shown in FIG. 5(a) and FIG. 5(b), different points from the nozzle 60a of FIG. 4(a) will be described.

First, the structural example shown in FIG. 5(a) will be described. As shown in FIG. 5(a), an electrically conductive resin pipe 93b is used in the nozzle of the present example instead of the second resin pipe 93 of FIG. 4(a) through which the metallic pipe 91 is inserted. Electrically conductive fluororesin having chemical resistance, for example, is used as resin for this electrically conductive resin pipe 93b. As the electrically conductive fluororesin, electrically conductive PTFE, electrically conductive PFA or the like is used.

Accordingly, the amount of the charges of the processing liquid flowing through the internal flow path fc of the first resin pipe 92 is sufficiently reduced. Consequently, the electric discharge from the processing liquid to the substrate W is reliably suppressed in the supply of the processing liquid from each nozzle 60a to 60c onto the substrate W. This more reliably prevents the patterns formed on the substrate W from being damaged.

Next, the structural example shown in FIG. 5(b) will be described. In the nozzle of the present example, the whole surface of the metallic pipe 91 is coated with a resin film 91c having superior chemical resistance, as shown in FIG. 5(b). Fluororesin (PTFE, PFA or the like), for example, is used as the resin film 91c.

Accordingly, the metallic pipe 91 coated with the resin film 91c having chemical resistance is further coated with the first resin pipe 92, the second resin pipe 93, the boss 94 and the welding resin 95. This reliably prevents the metallic pipe 91 from coming into contact with the chemical liquid and the chemical liquid atmosphere during the chemical liquid process of the substrate W. Thus, corrosion of the metallic pipe 91 caused by the chemical liquid and metallic contamination caused by elution of metallic ions are reliably prevented.

Note that the metallic pipe 91 of each nozzle 60a to 60c is connected to the ground line of the substrate processing apparatus 100 through the ground connection wire er in the nozzle device 600 according to the present embodiment, however, the metallic pipe 91 is not necessarily needed to be connected to the ground line.

In addition, although the second resin pipe 93 of each nozzle 60a to 60c is provided in the nozzle device 600 according to the present embodiment, the second resin pipe 93 is not necessarily needed, and can be eliminated in the case where the processing liquid that does not erode the metallic pipe 91 is used. The second resin pipe 93 may be eliminated in the case, for example, where the processing liquid is a chemical liquid with comparatively low density, pure water, functional water (including hydrogen water, nitrogen gas dissolved water, electrolytic ionic water) or the like. In this case, the metallic pipe 91 may be coated with the above mentioned resin film 91c.

The inventors of the present invention measured and compared the electric potential of the charges of the processing liquid before passing through each nozzle 60a to 60c and the electric potential of the charges of the processing liquid after passing through each nozzle 60a to 60c (discharged processing liquid) with the metallic pipe 91 of the nozzle 60a to 60c not being grounded.

In contrast to the electric potential of the charges of the processing liquid before passing through each nozzle 60a to 60c being −4.00 kv, the electric potential of the charges of the processing liquid after passing through each nozzle 60a to 60c was −0.14 kv.

This result made it clear that the electric potential of the charges of the processing liquid passing through the internal flow path fc is reduced even in the case where the metallic pipe 91 of each nozzle 60a to 60c is not connected to the ground line. Note that electric potential of charges of the substrate W is normally 0 kv, since the substrate W is not previously charged.

(7) OTHER EMBODIMENTS

While the three nozzles 60a to 60c that supply the processing liquid onto the substrate W are provided in the nozzle device 600 according to the above embodiment, the number of the nozzles provided in the nozzle device 600 is not limited. In the nozzle device 600, one nozzle as well as two or more than three of nozzles may be provided, for example.

While the use of SPM, SC2 and HF as the first to third chemical liquids is described in the above embodiment, other chemical liquids may be used for the first to third chemical liquids. In addition, while the use of pure water as the rinse liquid is described, other rinse liquids may be used.

As other chemical liquids, buffered hydrofluoric acid (BHF), diluted hydrofluoric acid (DHF), hydrochloric acid, sulfuric acid, nitric acid, phosphoric acid, acetic acid, oxalic acid, ammonia water, citric acid, oxygenated water, or aqueous solution of TMAH or the like, or a mixture solution thereof may be used.

As other rinse liquids, carbonated water, ozone water, magnetic water, regenerated water (hydrogen water), nitrogen gas dissolved water, ion water, or organic solvent such as IPA (isopropyl alcohol) or the like, for example, may be used.

In the substrate processing apparatus 100 according to the above embodiment, the nozzles 60a to 60c may be cleaned away by supplying pure water or the like to the nozzles 60a to 60c of the nozzle device 600.

Since the outer surfaces of the nozzles 60a to 60c have high water repellency in the case where the second resin pipes 93 of FIG. 4 are formed of fluororesin, the nozzles 60a to 60c can be cleaned away in a short time and cleaning level of the cleaning processing units 5a to 5d is improved.

(8) Correspondences Between Structural Elements in Claims and Elements in the Embodiments In the following paragraph, non-limiting examples of correspondences between various elements recited in the claims below and those described above with respect to various embodiments of the present invention are explained.

In the above embodiments, the second resin pipe 93 and the electrically conductive resin pipe 93b are examples of the second resin pipe, the opening on the tip of the first resin pipe 92 is an example of a discharge port, the first resin pipe 92 is an example of the first resin pipe. Moreover, the boss 94 and the welding resin 95 are examples of a sealing member, and the spin chuck 21 is an example of a substrate holder. As each of various elements recited in the claims, various other elements having structures or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A nozzle supported by a supporting member for supplying a processing liquid downward onto a substrate, comprising:
    a first resin pipe made of a resin material, through which said processing liquid flows;
    a metallic pipe made of a metallic material and provided to cover an outer periphery of said first resin pipe; and
    a second resin pipe made of a resin material and provided to cover an outer peripheral surface of said metallic pipe, wherein
    said first resin pipe, said metallic pipe and said second resin pipe constitute (1) an arm pipe having a first end where the processing liquid is received, and a second end, and extending in a horizontal direction, and (2) a downstream pipe extending so as to curve downward from the second end of said arm pipe, and
    said downstream pipe has on an end thereof a discharge port that discharges said processing liquid flowing from said first end to said second end of said arm pipe within said first resin pipe, and
    an end of said first resin pipe projects downward from an end of said second resin pipe.

2. The nozzle according to claim 1, wherein said resin material of said first resin pipe includes fluororesin.

3. The nozzle according to claim 1, wherein said resin material of said second resin pipe includes electrically conductive resin.

4. The nozzle according to claim 1, wherein said metallic pipe is grounded.

5. The nozzle according to claim 1, further comprising a resin film that coats a surface of said metallic pipe.

6. The nozzle according to claim 5, wherein said resin film is made of fluororesin.

7. The nozzle according to claim 1, wherein said metallic pipe is made of stainless steel.

8. The nozzle according to claim 1, wherein the end of said first resin pipe projects from an end of said metallic pipe.

9. The nozzle according to claim 8, wherein the end of said second resin pipe projects from the end of said metallic pipe.

10. The nozzle according to claim 1, further comprising a sealing member made of resin and sealing the end of said metallic pipe.

11. A substrate processing apparatus that performs a predetermined process on a substrate, comprising:
    a substrate holder that holds the substrate; and
    a nozzle for supplying a processing liquid downward onto the substrate held by said substrate holder, wherein
    said nozzle is supported by a supporting member, and includes a first resin pipe made of a resin material through which said processing liquid flows,
    a metallic pipe made of a metallic material and provided to cover an outer periphery of said first resin pipe, and
    a second resin pipe made of a resin material and provided to cover an outer peripheral surface of said metallic pipe, wherein
    said first resin pipe, said metallic pipe and said second resin pipe constitute (1) an arm pipe having a first end where the processing liquid is received, and a second end, and extending in a horizontal direction, and (2) a downstream pipe extending so as to curve downward from the second end of said arm pipe, and
    said downstream pipe has on an end thereof a discharge port that discharges said processing liquid flowing from said first end to said second end of said arm pipe within said first resin pipe, and
    an end of said first resin pipe projects downward from an end of said second resin pipe.

12. A nozzle supported by a supporting member for supplying a processing liquid downward onto a substrate, comprising:
    a first resin pipe made of a resin material, through which said processing liquid flows;
    a metallic pipe made of a metallic material and provided to cover an outer periphery of said first resin pipe;
    a second resin pipe made of a resin material and provided to cover an outer peripheral surface of said metallic pipe; and
    a sealing member made of resin and sealing an end of said metallic pipe; and
    said first resin pipe, said metallic pipe and said second resin pipe constitute (1) an arm pipe having a first end where the processing liquid is received, and a second end, and extending in a horizontal direction, and (2) a downstream pipe extending so as to curve downward from the second end of said arm pipe,
    said downstream pipe has on an end thereof a discharge port that discharges said processing liquid flowing from said first end to said second end of said arm pipe within said first resin pipe, and
    an end of said first resin pipe projects downward from said sealing member.

* * * * *